(12) United States Patent
Dierichs et al.

(10) Patent No.: US 8,953,144 B2
(45) Date of Patent: Feb. 10, 2015

(54) LITHOGRAPHIC APPARATUS AND DEVICE MANUFACTURING METHOD

(75) Inventors: Marcel Mathijs Theodore Marie Dierichs, Venlo (NL); Sjoerd Nicolaas Lambertus Donders, 's-Hertogenbosch (NL); Johannes Henricus Wilhelmus Jacobs, Eindhoven (NL); Hans Jansen, Eindhoven (NL); Erik Roelof Loopstra, Heeze (NL); Jeroen Johannes Sophia Maria Mertens, Duizel (NL); Marco Koert Stavenga, Eindhoven (NL); Bob Streefkerk, Tilburg (NL); Martinus Cornelis Maria Verhagen, Valkenswaard (NL); Lejla Seuntiens-Gruda, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 385 days.

(21) Appl. No.: 13/240,867

(22) Filed: Sep. 22, 2011

(65) Prior Publication Data

US 2012/0013870 A1    Jan. 19, 2012

Related U.S. Application Data

(63) Continuation of application No. 12/766,609, filed on Apr. 23, 2010, which is a continuation of application No. 10/924,192, filed on Aug. 24, 2004, now Pat. No. 7,773,459.

(30) Foreign Application Priority Data

Aug. 29, 2003   (EP) .................................. 03255376

(51) Int. Cl.
*G03B 27/52*         (2006.01)
*G03B 27/42*         (2006.01)
(Continued)

(52) U.S. Cl.
CPC .............. *B01D 61/025* (2013.01); *B01D 61/24* (2013.01); *G03F 7/70341* (2013.01); *C02F 1/04* (2013.01);
(Continued)

(58) Field of Classification Search
CPC ........................... G03F 7/70341; G03F 7/2041
USPC ............ 355/53, 30, 55, 77, 72; 359/380, 886; 210/188, 321.6, 650, 640
See application file for complete search history.

(56) References Cited

U.S. PATENT DOCUMENTS 3,573,975 A    4/1971   Dhaka et al.
3,648,587 A    3/1972   Stevens
(Continued)

FOREIGN PATENT DOCUMENTS

DE    206 607    2/1984
DE    221 563    4/1985
(Continued)

OTHER PUBLICATIONS

Japanese Office Action mailed May 2, 2013 in corresponding Japanese Patent Application No. 2011-163844.
(Continued)

*Primary Examiner* — Peter B Kim
(74) *Attorney, Agent, or Firm* — Pillsbury Winthrop Shaw Pittman LLP

(57) ABSTRACT

In a lithographic projection apparatus, a liquid supply system maintains liquid in a space between the projection system and the substrate. The liquid supply system may further include a de-mineralizing unit, a distillation unit, a de-hydrocarbonating unit, a UV radiation source, and/or a filter configured to purify the liquid. A gas content reduction device may be provided to reduce a gas content of the liquid. A chemical may be added to the liquid using an adding device to inhibit lifeform growth and components of the liquid supply system may be made of a material which is non-transparent to visible light such that growth of lifeforms may be reduced.

22 Claims, 3 Drawing Sheets

(51) Int. Cl.
  *B01D 61/02* (2006.01)
  *B01D 61/24* (2006.01)
  *G03F 7/20* (2006.01)
  *C02F 1/04* (2006.01)
  *C02F 1/28* (2006.01)
  *C02F 1/32* (2006.01)
  *C02F 1/42* (2006.01)
  *C02F 1/44* (2006.01)

(52) U.S. Cl.
  CPC . *C02F 1/283* (2013.01); *C02F 1/32* (2013.01); *C02F 1/42* (2013.01); *C02F 1/441* (2013.01); *G03F 7/2041* (2013.01)
  USPC .............................................. 355/30; 355/53

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,053,060 A | 10/1991 | Kopf-Sill et al. |
| 5,121,256 A | 6/1992 | Corle et al. |
| 5,425,227 A | 6/1995 | Konig |
| 5,589,005 A | 12/1996 | Ohmi |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 5,997,745 A | 12/1999 | Tonelli et al. |
| 6,191,429 B1 | 2/2001 | Suwa |
| 6,236,634 B1 | 5/2001 | Lee et al. |
| 6,423,223 B1 | 7/2002 | Northcut et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,844,206 B1 | 1/2005 | Phan et al. |
| 6,867,844 B2 | 3/2005 | Vogel et al. |
| 6,952,253 B2 | 10/2005 | Lof et al. |
| 6,954,256 B2 | 10/2005 | Flagello et al. |
| 7,009,682 B2 | 3/2006 | Bleeker |
| 7,050,146 B2 | 5/2006 | Duineveld et al. |
| 7,075,616 B2 | 7/2006 | Derksen et al. |
| 7,078,575 B1 | 7/2006 | Qiu et al. |
| 7,081,943 B2 | 7/2006 | Lof et al. |
| 7,156,925 B1 | 1/2007 | Subramanian et al. |
| 7,193,232 B2 | 3/2007 | Lof et al. |
| 7,199,858 B2 | 4/2007 | De Smit et al. |
| 7,213,963 B2 | 5/2007 | Lof et al. |
| 7,224,456 B1 | 5/2007 | Phan et al. |
| 7,251,017 B2 | 7/2007 | Novak et al. |
| 7,317,504 B2 | 1/2008 | De Smit et al. |
| 7,326,522 B2 | 2/2008 | Dierichs |
| 7,349,064 B2 | 3/2008 | Nakano |
| 7,359,030 B2 | 4/2008 | Simon et al. |
| 7,394,521 B2 | 7/2008 | Van Santen et al. |
| 7,436,486 B2 | 10/2008 | Hirukawa |
| 7,466,392 B2 | 12/2008 | Nagasaka et al. |
| 7,480,029 B2 | 1/2009 | Hara |
| 7,515,246 B2 | 4/2009 | Nagasaka et al. |
| 7,522,259 B2 | 4/2009 | Hazelton et al. |
| 7,545,481 B2 | 6/2009 | Streefkerk et al. |
| 7,589,818 B2 | 9/2009 | Mulkens et al. |
| 7,733,459 B2 | 6/2010 | Dierichs et al. |
| 7,779,781 B2 | 8/2010 | Mertens et al. |
| 8,142,852 B2 | 3/2012 | Mertens et al. |
| 8,629,970 B2 * | 1/2014 | Sewell et al. .................. 355/30 |
| 2002/0012626 A1 | 1/2002 | Tanaka et al. |
| 2002/0020821 A1 | 2/2002 | Van Santen et al. |
| 2002/0023865 A1 | 2/2002 | Northcut et al. |
| 2002/0163629 A1 | 11/2002 | Switkes et al. |
| 2002/0191173 A1 | 12/2002 | Kwan |
| 2003/0005944 A1 | 1/2003 | Pagliaro, Jr. et al. |
| 2003/0007136 A1 * | 1/2003 | Emoto et al. .................. 355/30 |
| 2003/0011763 A1 | 1/2003 | Taniguchi et al. |
| 2003/0034292 A1 | 2/2003 | Rela |
| 2003/0111416 A1 | 6/2003 | Kubota et al. |
| 2003/0123040 A1 | 7/2003 | Almogy |
| 2003/0172956 A1 | 9/2003 | Hashi et al. |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0050786 A1 | 3/2004 | Dey et al. |
| 2004/0075895 A1 | 4/2004 | Lin |
| 2004/0094463 A1 | 5/2004 | Laverdiere et al. |
| 2004/0109237 A1 | 6/2004 | Epple et al. |
| 2004/0119954 A1 | 6/2004 | Kawashima et al. |
| 2004/0125351 A1 | 7/2004 | Krautschik et al. |
| 2004/0180299 A1 | 9/2004 | Rolland et al. |
| 2004/0224265 A1 | 11/2004 | Endo et al. |
| 2004/0228882 A1 | 11/2004 | Qiu et al. |
| 2004/0263809 A1 | 12/2004 | Nakano |
| 2005/0007570 A1 | 1/2005 | Streefkerk et al. |
| 2005/0024609 A1 | 2/2005 | De Smit et al. |
| 2005/0048223 A1 | 3/2005 | Pawloski et al. |
| 2005/0078286 A1 | 4/2005 | Dierichs et al. |
| 2005/0078287 A1 | 4/2005 | Sengers et al. |
| 2005/0083504 A1 | 4/2005 | Moors et al. |
| 2005/0122498 A1 | 6/2005 | Jasper |
| 2005/0134817 A1 | 6/2005 | Nakamura |
| 2005/0140956 A1 | 6/2005 | Kroon et al. |
| 2005/0164522 A1 | 7/2005 | Kunz et al. |
| 2005/0173647 A1 | 8/2005 | Bakker |
| 2005/0175940 A1 | 8/2005 | Dierichs |
| 2005/0185155 A1 | 8/2005 | Kishikawa |
| 2005/0186514 A1 | 8/2005 | French et al. |
| 2005/0205108 A1 | 9/2005 | Chang et al. |
| 2005/0213061 A1 | 9/2005 | Hakey et al. |
| 2005/0219482 A1 | 10/2005 | Baselmans et al. |
| 2005/0219490 A1 | 10/2005 | Owa |
| 2005/0264774 A1 | 12/2005 | Mizutani et al. |
| 2005/0274898 A1 | 12/2005 | Watanabe et al. |
| 2005/0277069 A1 | 12/2005 | Endo et al. |
| 2005/0286031 A1 | 12/2005 | French et al. |
| 2005/0288535 A1 | 12/2005 | Wheland et al. |
| 2006/0023182 A1 | 2/2006 | Novak et al. |
| 2006/0023185 A1 | 2/2006 | Hazelton et al. |
| 2006/0028626 A1 | 2/2006 | Chang et al. |
| 2006/0028632 A1 | 2/2006 | Hazelton et al. |
| 2006/0254078 A1 | 11/2006 | O'Donnell |
| 2007/0047093 A1 | 3/2007 | Hoering et al. |
| 2007/0139631 A1 | 6/2007 | Novak et al. |

FOREIGN PATENT DOCUMENTS

| | | |
|---|---|---|
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| EP | 1 486 827 | 12/2004 |
| EP | 1 489 462 | 12/2004 |
| EP | 1 571 697 | 9/2005 |
| EP | 1 571 701 | 9/2005 |
| EP | 1571698 | 9/2005 |
| EP | 1 612 850 | 1/2006 |
| EP | 1 653 501 | 5/2006 |
| EP | 1 793 276 A2 | 6/2007 |
| FR | 2474708 | 7/1981 |
| JP | 58-202448 | 11/1983 |
| JP | 61-187984 | 8/1986 |
| JP | 62-065326 | 3/1987 |
| JP | 62-121417 | 6/1987 |
| JP | 63-108724 | 5/1988 |
| JP | 63-157419 | 6/1988 |
| JP | 04-305915 | 10/1992 |
| JP | 04-305917 | 10/1992 |
| JP | 06-124873 | 5/1994 |
| JP | 06-265555 | 9/1994 |
| JP | 06-277659 | 10/1994 |

(56) References Cited

FOREIGN PATENT DOCUMENTS

| | | |
|---|---|---|
| JP | 07-132262 | 5/1995 |
| JP | 07-220990 | 8/1995 |
| JP | 9-192661 | 7/1997 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-051865 | 2/2000 |
| JP | 2000-058436 | 2/2000 |
| JP | 2000-087579 | 3/2000 |
| JP | 2000-266763 | 9/2000 |
| JP | 2001-091849 | 4/2001 |
| JP | 2001-153855 | 6/2001 |
| JP | 2002-018431 | 1/2002 |
| JP | 2002-273442 | 9/2002 |
| JP | 2002-355683 | 12/2002 |
| JP | 2003-071444 | 3/2003 |
| JP | 2003-126850 | 5/2003 |
| JP | 2003-142447 | 5/2003 |
| JP | 2003-145146 | 5/2003 |
| JP | 2003-181260 | 7/2003 |
| JP | 2003-185389 | 7/2003 |
| JP | 2003-236535 | 8/2003 |
| JP | 2004-193252 | 7/2004 |
| JP | 2004-327638 | 8/2004 |
| JP | 2004-282023 | 10/2004 |
| JP | 2004-289126 | 10/2004 |
| JP | 2004-327747 | 11/2004 |
| JP | 2004-356205 | 12/2004 |
| JP | 2005-019615 | 1/2005 |
| JP | 2005-019864 | 1/2005 |
| JP | 2005-72404 | 3/2005 |
| JP | 2005-79222 | 3/2005 |
| JP | 2005-079238 | 3/2005 |
| JP | 2005-209705 | 8/2005 |
| JP | 2005-268742 | 9/2005 |
| JP | 2006-18286 | 1/2006 |
| JP | 2006-19720 | 1/2006 |
| JP | 2006-24692 | 1/2006 |
| JP | 2006-24882 | 1/2006 |
| JP | 2006-24939 | 1/2006 |
| JP | 2006-24954 | 1/2006 |
| JP | 2006-30212 | 2/2006 |
| JP | 2006-32963 | 2/2006 |
| JP | 2006-48029 | 2/2006 |
| JP | 2006-49757 | 2/2006 |
| JP | 2006-73951 | 3/2006 |
| JP | 2006-509568 | 3/2006 |
| JP | 2006-108696 | 4/2006 |
| JP | 2006-148093 | 6/2006 |
| JP | 2006-156974 | 6/2006 |
| JP | 2006-165502 | 6/2006 |
| JP | 2006/179909 | 7/2006 |
| JP | 2006/190997 | 7/2006 |
| JP | 2006/245573 | 9/2006 |
| JP | 2006/352032 | 12/2006 |
| JP | 2007-19548 | 1/2007 |
| JP | 2007-27674 | 2/2007 |
| JP | 2007-59929 | 3/2007 |
| JP | 1 777 589 A2 | 4/2007 |
| JP | 2007-110107 | 4/2007 |
| JP | 2007-123775 | 5/2007 |
| JP | 2007-123776 | 5/2007 |
| JP | 2007-123882 | 5/2007 |
| WO | WO 99/49504 | 9/1999 |
| WO | WO 02/02728 A1 | 1/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | 2004/092833 | 10/2004 |
| WO | 2004/093130 | 10/2004 |
| WO | 2005/015315 | 2/2005 |
| WO | 2005/022615 | 3/2005 |
| WO | WO 2005/031820 A1 | 4/2005 |
| WO | WO 2005/050324 A3 | 6/2005 |
| WO | WO 2005/064409 A2 | 7/2005 |
| WO | WO 2005/064409 A3 | 7/2005 |
| WO | WO 2005/071491 A2 | 8/2005 |
| WO | WO 2005/076321 A1 | 8/2005 |
| WO | WO 2005/076323 A1 | 8/2005 |
| WO | WO 2005/114711 A1 | 12/2005 |
| WO | 2006/029824 A2 | 3/2006 |
| WO | 2006/029824 A3 | 3/2006 |
| WO | WO 2006/051909 A1 | 5/2006 |
| WO | WO 2006/062065 A1 | 6/2006 |
| WO | WO 2006/115268 A1 | 11/2006 |
| WO | WO 2006/137410 A1 | 12/2006 |
| WO | WO 2007/005362 A2 | 1/2007 |

OTHER PUBLICATIONS

U.S. Office Action dated Apr. 10, 2013 in corresponding U.S. Appl. No. 12/766,609.
U.S. Office Action mailed Dec. 4, 2012 in corresponding U.S. Appl. No. 12/766,609.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future Fab International, vol. 15, Jul. 11, 2003.
H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.
G. Owen et al., "1/8 μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.

(56) References Cited

OTHER PUBLICATIONS

S. Owa et al., "Update on 193nm immersion exposure tool", Litho Forum, International Sematech, Los Angeles, Jan. 27-29, 2004, Slide Nos. 1-51.
H. Hata, "The Development of Immersion Exposure Tools", Litho Forum, International Sematech, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).
European Search Report for EP 03255376.0 dated Jul. 21, 2004.
Search Report for European Application No. EP 04255118, dated Jan. 11, 2005.
United States Official Action issued for U.S. Appl. No. 10/852,681, dated Apr. 25, 2006.
Japanese Official Action issued for Japanese Patent Application No. 2004-247635, dated Sep. 4, 2007.
English translation of Official Action issued on Mar. 28, 2008 in corresponding Chinese Application No. 200410068266.6.
English translation of Official Action issued on Dec. 5, 2008 in Chinese Application No. 200410068266.6.
Semi F63-0309, "Guide for ultrapure water used in semiconductor processing," Jul. 21, 2001.
International Technology Roadmap for Semiconductors 2003 Edition, Yield Enhancement, Jan. 21, 2004.
English translation of an Office Action in Chinese Patent Application No. CN200410068266.6, dated Feb. 20, 2009.
"Lenntech Water Conductivity" http://www.lenntech.com/water-conductivity.htm, 1998.
Hayami et al., Characterization of cleaning technology for silicon surfaces by hot pure water containing little dissolved oxygen 1996.
European Search Report dated Oct. 7, 2010 in related European patent application No. 10172568.7.
European Search Report dated Jan. 7, 2011 in European patent application No. 10179595.
Japanese Office Action mailed Jan. 27, 2011 in Japanese patent application No. 2007-339406.
U.S. Office Action dated Apr. 25, 2014 in corresponding U.S. Appl. No. 13/242,221.

* cited by examiner

LITHOGRAPHIC APPARATUS AND DEVICE MANUFACTURING METHOD

The present application is a continuation of co-pending U.S. patent application Ser. No. 12/766,609, filed Apr. 23, 2010, which is a continuation of U.S. patent application Ser. No. 10/924,192, filed Aug. 24, 2004, now U.S. Pat. No. 7,733,459, which claims priority from European patent application EP 03255376.0, filed Aug. 29, 2003, the entire contents of each of the foregoing applications is hereby incorporated by reference.

FIELD

The present invention relates to a lithographic projection apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning devices as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.)

One proposal is to submerse the substrate or both substrate and substrate table in a bath of liquid (see, for example, U.S. Pat. No. 4,509,852, hereby incorporated in its entirety by reference).

Another of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is confined to a localized area by being supplied by at least one inlet IN onto the substrate, preferably along the direction of movement of the substrate relative to the final element, and by being removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Another solution which has been proposed is to contain the liquid to a localised area of the substrate with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal.

SUMMARY

The properties of the immersion liquid should be carefully controlled such that its optical properties remain constant and so that elements of the supply and projection systems are not contaminated with deposits.

Accordingly, it would be advantageous, for example, to provide a liquid supply system in which the quality of immersion liquid can be controlled.

According to an aspect of the invention, there is provided a lithographic apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprising a liquid purifier configured to purify the liquid.

In this way the lithographic projection apparatus may, for example, be attached to a normal main water supply rather than requiring a source of pre-purified water. This is advantageous as purified water can be expensive and the amount remaining would clearly require monitoring so that it does not run out. In another embodiment, immersion liquids other than water may be used, for example, because water may not be suitable for use with a projection beam of 157 nm wavelength.

In an embodiment, the liquid purifier comprises a (water) distillation unit, and additionally or alternatively the liquid purifier may comprise a (water) demineralizer. In this way, for example, water supplied from a normal main water supply can be supplied to the lithographic projection apparatus where the water is brought to a purity acceptable for use as immersion liquid by choice of purification units. Of course other additions may be required to the water such as, for example, wetting agents. If the immersion liquid is not water, other types of purifier may be needed in addition to or instead of the distillation unit and demineralizer.

In an embodiment, the (water) demineralizer is a reverse osmosis unit.

In a further embodiment, the liquid purifier comprises a filter, which may be dynamically isolated from one or more further components in the liquid supply system. The dynamic isolation of the filter helps to prevent clusters of particles which may form in the filter from breaking up and being emitted downstream. Thus, particle contamination of the substrate may be reduced and, in turn, yield may be increased.

In an embodiment, the liquid supply system includes a re-circulation mechanism configured to re-use immersion liquid in the space without purifying the immersion liquid for a re-use. Such a system may be advantageous, for example, because immersion liquid may be re-used without re-purifying thereby improving the economy of the lithographic projection apparatus.

In a further embodiment of the invention, there is provided a lithographic apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprising an ultra-violet radiation source configured to irradiate the liquid prior to entry into the space.

An ultra-violet source, which is a source other than the projection beam of the lithographic projection apparatus, may be effective to kill lifeforms present in the immersion liquid (water) thereby preventing further growth. Such lifeforms may include algae which would otherwise contaminate the lithographic projection apparatus.

In another embodiment of the invention, there is provided a lithographic projection apparatus lithographic projection apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprises a component configured to prevent the liquid from being irradiated by visible light.

In an embodiment, the component comprises a container or enclosure non-transparent to visible light surrounding the liquid supply system. In another embodiment, the component comprises conduits which are non-transparent to visible light configured to supply the liquid from a liquid source to the space. Lifeforms, such as algae, typically require visible light so that they can photosynthesize and grow. By preventing visible light from reaching the immersion liquid, any lifeforms within the immersion liquid which require light for life will die. In this way the quality of the immersion liquid may be maintained, if not improved, and contamination reduced.

In another embodiment of the invention, there is provided a lithographic projection apparatus lithographic projection apparatus comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid supply system comprises a device configured to add a lifeform-growth inhibiting chemical to the liquid. In this solution, lifeforms such as algae may be killed by chemical attack.

According to another aspect of the present invention, there is provided a liquid for use in a space between a projection system of an immersion lithographic projection apparatus and a substrate to be imaged, the liquid comprising a lifeform-growth inhibiting chemical. Such an immersion liquid may lead to less contamination and may be more easily controlled in composition than an immersion liquid which does not include a lifeform-growth inhibiting chemical.

According to another aspect, there is provided a lithographic projection apparatus, comprising:

an illumination system configured to condition a radiation beam;

a support constructed to hold a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and a liquid supply system configured to at least partly fill a space between the projection system and the substrate with a liquid, the liquid being water or an aqueous solution having one or more of the following properties (a) to (f):

(a) an electrical conductivity of from 0.055 microSiemens/cm to 0.5 microSiemens/cm;

(b) a pH of from 5 to 8 or from 6 to 8;

(c) a content of organic compounds of 5 ppb or less or of 1 ppb or less;

(d) a particle content of no more than 2 particles having a dimension of 50 nm or greater per ml of liquid, or of no more than 0.5 particles having a dimension of 50 nm or greater per ml of liquid;

(e) a dissolved oxygen concentration of 15 ppb or less or of 5 ppb or less; and (f) a silica content of 500 ppt or less or of 100 ppt or less.

In this embodiment, the immersion liquid may have a high purity, leading to a reduction in contamination of various elements in the system which contact the liquid, and helping to avoid optical changes or imperfections. The immersion liquid may be purified using a liquid purifier which is incorporated into the lithographic apparatus as described above, or using a remote purification system (e.g. a point-of-use filter or a purification unit that supplies liquid to the lithographic apparatus as well as other liquid users). In particular, the apparatus of this embodiment may avoid or lessen the impact of one or more of the following difficulties:

liquid stains on the optical elements and/or on the substrate, caused by immersion liquid drying on or being evacuated from the surface of the element/substrate;

contamination of outer elements of the projection system by organic species;

printing defects caused by particles or bubbles in or close to the focus plane;

optical defects such as straylight;

damage to the resist through reaction with materials in the immersion liquid (e.g. bases) and contamination of the resist surface through deposition of impurities.

According to a further aspect of the present invention, there is provided a liquid for use in a space between a projection system of an immersion lithographic projection apparatus and a substrate to be imaged, wherein the liquid has one or more of the following properties (a) to (f):

(a) an electrical conductivity of from 0.055 microSiemens/cm to 0.5 microSiemens/cm;

(b) a pH of from 5 to 8 or from 6 to 8;

(c) a content of organic compounds of 5 ppb or less or of 1 ppb or less;

(d) a particle content of no more than 2 particles having a dimension of 50 nm or greater per ml of liquid, or of no more than 0.5 particles having a dimension of 50 nm or greater per ml of liquid;

(e) a dissolved oxygen concentration of 15 ppb or less or of 5 ppb or less; and (f) a silica content of 500 ppt or less or of 100 ppt or less.

Such an immersion liquid may help to avoid contamination and to avoid or reduce the difficulties mentioned in the above paragraph.

According to a further aspect of the invention there is provided a device manufacturing method, comprising:

providing a liquid to at least partly fill a space between a projection system of a lithographic apparatus and a substrate; and projecting a patterned beam of radiation through the liquid onto a target portion of the substrate; and comprising providing untreated water as the liquid to the lithographic apparatus and purifying the untreated water using a liquid purifier immediately prior to providing the liquid to the space; or irradiating the liquid with ultra-violet radiation prior to providing the liquid to the space; or providing the liquid from a liquid source to the space via a conduit which is non-transparent to visible light; or providing a lifeform growth inhibiting chemical to the liquid prior to providing the liquid to the space; or providing water or an aqueous solution as the liquid, the water or the aqueous solution having one or more of the following properties (a) to (f):

(a) an electrical conductivity of from 0.055 microSiemens/cm to 0.5 microSiemens/cm;

(b) a pH of from 5 to 8, preferably from 6 to 8;

(c) a content of organic compounds of 5 ppb or less, preferably 1 ppb or less;

(d) a particle content of no more than 2 particles having a dimension of 50 nm or greater per ml of immersion liquid, preferably no more than 0.5 particles having a dimension of 50 nm or greater per ml of immersion liquid;

(e) a dissolved oxygen concentration of 15 ppb or less, preferably 5 ppb or less; and (f) a silica content of 500 ppt or less, preferably 100 ppt or less.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
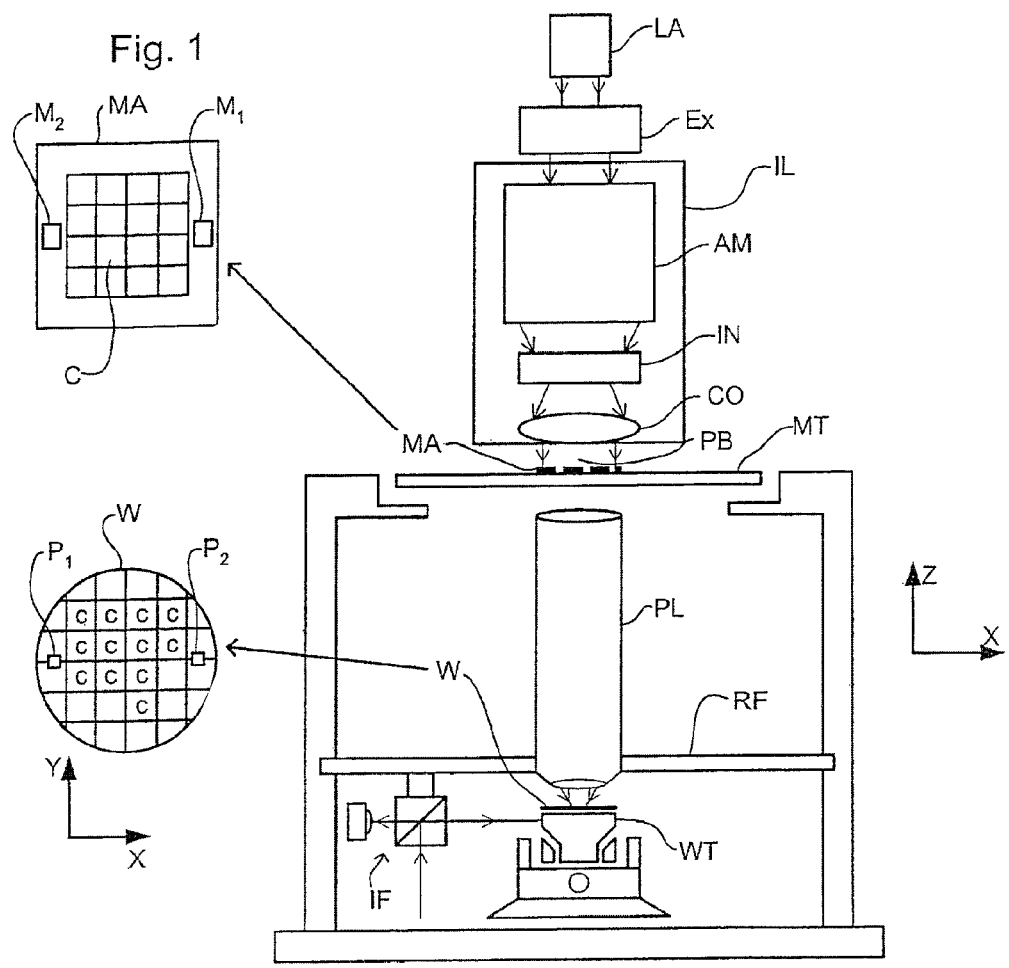
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to a first positioning device for accurately positioning the mask with respect to item PL;

a second object table (substrate table) WT provided with a substrate holder for holding a substrate W (e.g. a resist-coated silicon wafer), and connected to a second positioning device for accurately positioning the substrate with respect to item PL;

a projection system ("projection lens") PL (e.g. a refractive system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed a conditioner, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device (and interferometer IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 4:
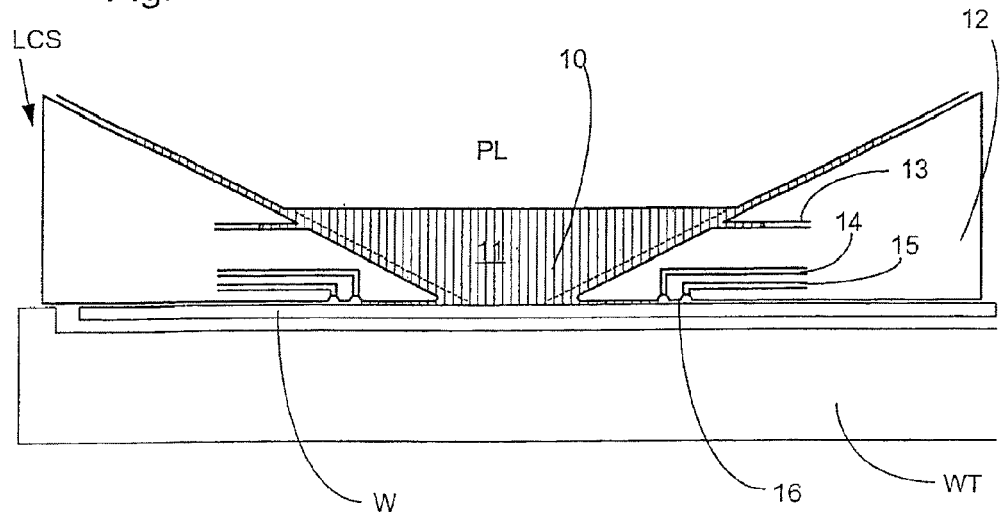
FIG. 4 illustrates another liquid supply system according to an embodiment of the invention.

FIG. 4 shows a liquid reservoir 10 between the projection system PL and a substrate W which is positioned on the substrate stage WT. The liquid reservoir 10 is filled with a liquid 11 having a relatively high refractive index, provided via inlet/outlet ducts 13. The liquid may be water (as in this description) but can be any suitable liquid. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

In an embodiment, the reservoir 10 forms a seal, e.g., a contactless seal, to the substrate W around the image field of the projection system PL so that the liquid is confined to fill the space between the substrate's primary surface, which faces the projection system PL, and the final optical element of the projection system PL. The reservoir is formed by a seal member 12 positioned below and surrounding the final element of the projection system PL. Thus, the liquid containment system LCS provides liquid on only a localized area of the substrate. The seal member 12 forms part of the liquid containment system LCS for filling the space between the final element of the projection system and an object, such as a substrate W or a sensor, on the substrate table WT with a liquid. This liquid is brought into the space below the projection system and within the seal member 12. The seal member 12 extends a little above the bottom element of the projection system and the liquid rises above the final element so that a buffer of liquid is provided. The seal member 12 has an inner periphery that at the upper end closely conforms to the shape of the projection system or the final elements thereof and may, e.g. be round. At the bottom the inner periphery forms an aperture which closely conforms to the shape of the image field, e.g. rectangular, though this is not necessarily so. The projection beam passes through this aperture.

The liquid 11 is confined in the reservoir 10 by a seal device 16. As illustrated in FIG. 4, the seal device is a contactless seal, i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 2:
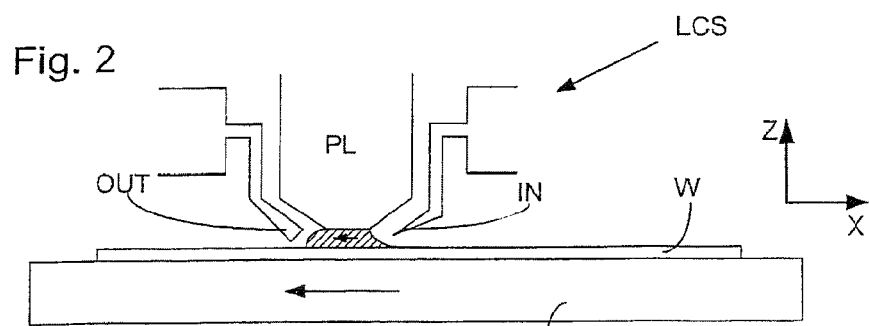
FIG. 2 illustrates a liquid supply system according to an embodiment of the invention.
Figure 3:
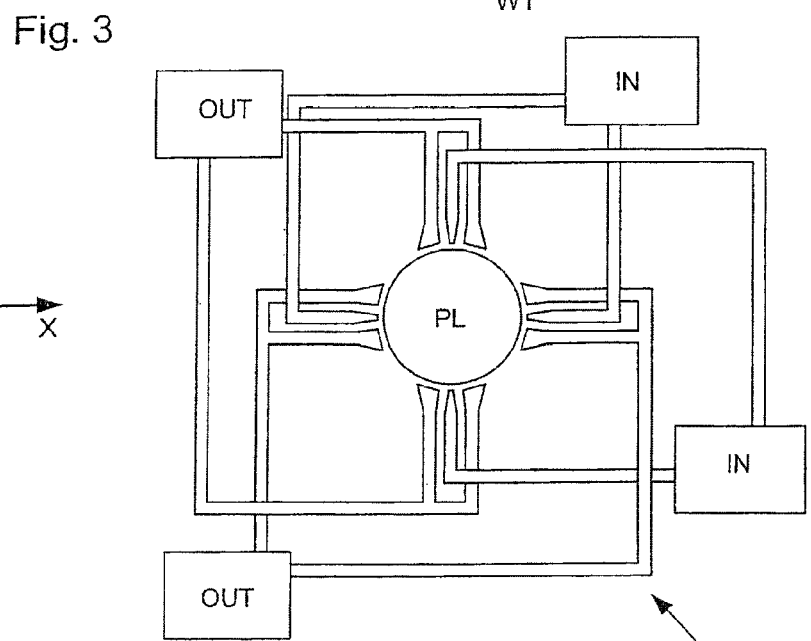
FIG. 3 illustrates, in plan, the system of FIG. 3.

FIGS. 2 and 3 also depict a liquid reservoir defined by inlet(s) IN, outlet(s) OUT, the substrate W and the final element of projection system PL. Like the liquid containment system of FIG. 4, the liquid supply system illustrated in FIGS. 2 and 3, comprising inlet(s) IN and outlet(s) OUT, supplies liquid to a space between the final element of the projection system and a localized area of the primary surface of the substrate.

Figure 5:
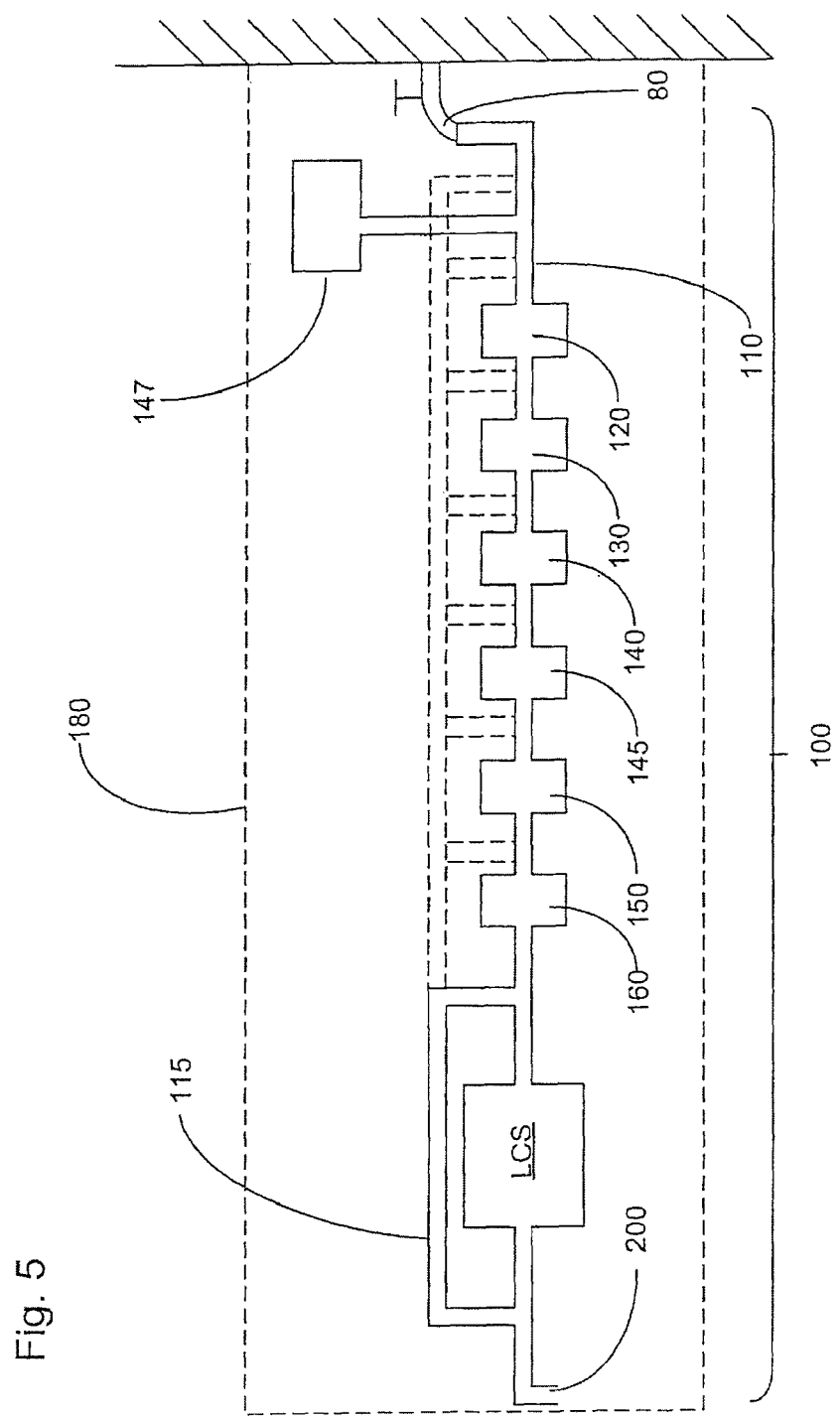
FIG. 5 illustrates a liquid supply system from a liquid source to disposal according to an embodiment of the present invention.

Both of the liquid supply systems of FIGS. 2 and 3 and of FIG. 4 as well as other solutions, such as a bath in which the substrate W or the whole substrate table WT is immersed, can be used with the liquid supply system of an embodiment of the present invention which is illustrated in FIG. 5.

FIG. 5 shows a liquid supply system 100 according to an embodiment of the invention in greater detail. The liquid supply system may comprise any sort of liquid containment system LCS such as described above, for example. The liquid supply system 100 forms part of the lithographic projection apparatus. The liquid supply system 100 is designed so that a standard water source 80, for example a main supply of water, can be used as the immersion liquid source. However, other liquids may also be used, in which case re-circulation as described below is more likely to be used and purification may become more important.

Main supply water should require treatment by a liquid purifier before it is suitable as an immersion liquid. Other immersion liquids also require such treatment especially if recycled as contamination can occur during use. In an embodiment, the purifier may be a distillation unit 120 and/or a demineralizer 130 and/or a de-hydro carbonating unit 140 for reducing the hydrocarbon content of the liquid and/or a filter 150. The demineralizer 130 may be of any sort such as a reverse osmosis unit, ion exchange unit or electric de-ionization unit, or a combination of two or more of these units. The demineralizer typically reduces the content of ionic compounds in water or an aqueous solution such that the electrical conductivity of the water or the aqueous solution is between 0.055 microSiemens/cm and 0.5 microSiemens/cm. The demineralizer may also reduce the silica content to 500 ppt or less, or to 100 ppt or less.

The de-hydrocarbonating unit 140 configured to reduce the hydrocarbon content of the liquid may be of the type which absorbs the hydrocarbons (e.g. charcoal or polymeric materials) or by combination of a UV light source and an ion exchanger. This unit 140 typically reduces the content of organic compounds in water or an aqueous solution to 5 ppb or less, for example to 3 ppb or less or to 2 ppb or less, to 1 ppb or less or to 0.5 ppb or less. The demineralizer 130 will in any case remove some of the hydrocarbons.

The filter 150 typically reduces the particle content of the immersion liquid to 2 particle/ml or less, to 1 particle/ml or less, or to 0.5 particle/ml or less, wherein a particle is defined as a particle having at least one dimension of 50 nm or greater. In an embodiment, the filter 150 is dynamically isolated from one or more of the other components in the liquid supply system. Typically, the filter 150 is dynamically isolated from components in the liquid supply system, which may cause mechanical shock. The filter 150, together with any hosing and components downstream of the filter may, for example, be dynamically isolated from any components in the system causing mechanical shocks and/or vibrations, for example motors, switching valves, moving parts and turbulent gas flow.

Before entering a liquid containment system LCS, the liquid passes through a gas content reduction device 160. The reduction in the gas content decreases the likelihood of bubble formation and the gas content reduction device therefore acts as a bubble reduction device. The gas content reduction device 160 typically reduces the dissolved oxygen content of the immersion liquid to 15 ppb or less, to 10 ppb or less or to 5 ppb or less. The gas content reduction device 160 may work using ultra sonic waves as described in U.S. patent application Ser. No. 10/860,662, hereby incorporated in its entirety by reference, or on similar principles using mega sonic waves (about 1 MHz) which avoid some of the disadvantages of ultra sonic waves (which can lead to cavitation and bubble collision with walls resulting in small particles breaking off the walls and contaminating the liquid). Other gas content reduction devices are also possible, for example those described in the above mentioned U.S. patent application as well as the use of membranes perhaps in combination with a vacuum or by purging the liquid with a low solubility gas, such as helium. Membranes are already used for removal of gasses from liquids in fields such as microelectronics, pharmaceutical and power applications. The liquid is pumped through a bundle of semiporous membrane tubing. The pores of the membrane are sized so that the liquid cannot pass through them but the gasses to be removed can. Thus the liquid is degassed. The process can be accelerated by applying to the outside of the tubing a low pressure. Liqui-Cel™ Membrane Contractors available from Membrana-Charlotte, a division of Celgard Inc. of Charlotte, N.C., USA are, for example, suitable for this purpose.

Purging with a low solubility gas is a known technique applied in high performance liquid chromatography (HPLC) to prevent gas bubble trapping in a reciprocating pump head. When the low solubility gas is purged through the liquid, it drives out other gases, such as carbon dioxide and oxygen.

After use in the liquid containment system LCS, the immersion liquid may be disposed of through a drain 200. Alternatively, the immersion liquid (or part thereof) which has already been used in the liquid containment system LCS may be recycled to pass through the liquid containment system again (via conduit 115) either with or without passing through all or some components of the liquid purifier. The liquid purifier may be made up of other components and the distillation unit 120, demineralizer 130, de-hydrocarbonating unit 140 and filter 150 may be positioned in any order.

Recycling of immersion liquid which has not yet passed through the liquid containment system LCS is also envisaged. For example, liquid may be extracted from the liquid purifier after having passed through one or more of the components, and recycled via conduit 115 to enter the liquid purifier again at a location further up-stream. In this way, the immersion liquid passes through at least one of the components of the liquid purifier more than once before entering the liquid containment system. This embodiment has an advantage that an improved immersion liquid purity may be achieved.

Recycling the immersion liquid, either before or after passing through the liquid containment system, also enables the immersion liquid to be kept flowing at all times, even when there is no flow through outlet 200. This helps to avoid the presence of stagnant liquid in the system, which is an advantage since stagnant liquid (such as water) is known to be prone to contamination due to, for example, leaching from construction materials.

In FIG. 5, liquid pumps used to re-circulate immersion liquid and to circulate liquid in the liquid containment system LCS are not illustrated.

The liquid supply system 100 of FIG. 5 also has several measures intended for the reduction or elimination of growth of lifeforms in the immersion liquid. Even very low levels of such lifeforms in a main water supply 80 may lead to contamination of the liquid supply system 100. Such lifeforms can include algae, bacteria and fungi.

There are at least three main ways to reduce the growth of such lifeforms which are illustrated in FIG. 5. It will be appreciated that these ways may be used individually or in any combination. The first way, effective for algae and other green plants, is to ensure that liquid is not irradiated with visible light, for example by ensuring that the conduits 110, 115 transporting water in the liquid supply system 100 are manufactured of a material which is non-transparent to visible light. Alternatively, the conduits 110, 115 may be clad in a material which does not transmit visible light. Alternatively or in addition, the entire liquid supply system 100 or even the whole apparatus may be housed in a container or enclosure (such as a room) 180 which is not transparent to visible light. In this way, the organisms in the liquid cannot photosynthesize and therefore cannot grow or increase. Suitable non-visible light transmissive materials are stainless steels, polymers etc.

FIG. 5 also illustrates the use of an ultra-violet source 145 which is used to illuminate the immersion liquid. The UV source 145 is used to illuminate the liquid before it passes through the liquid containment system LCS such that it is a separate illumination system to the projection beam PB (which is used to image the substrate W). The UV source 145 may be positioned anywhere in the liquid supply system 100 upstream of the liquid containment system LCS. The UV source kills lifeforms which are then removed from the liquid by a particle filter, for example filter 150. A suitable pore size for the filter is 0.03 to 2.0 μm though other sizes may also be used, for example 0.1 to 2.0 μm.

A further way of reducing the effect of organisms on the lithographic projection apparatus is to add a lifeform-growth inhibiting chemical into the immersion liquid (which, in the case illustrated in FIG. 5, is water). This is achieved using a lifeform-growth inhibiting chemical adding device 147 which may be positioned upstream or downstream of any of the other components 120, 130, 140, 145, 150, 160 of the liquid supply system. Typical chemicals are halogen containing compounds (mostly chlorine or bromine based), alcohols, aldehydes, ozone and heavy metals. The dose level of any such chemical should be very low to ensure that the immersion liquid purity requirements are met. In an embodiment, lifeform-growth inhibiting chemical is not used in order that the immersion liquid purity requirements are met.

Of course the adding device 147 may also add other chemicals to the immersion liquid such as surfactants and wetting agents.

While the embodiment in FIG. 5 is illustrated with the immersion liquid first being distilled, then de-mineralized then dehydrocarbonated and then irradiated with UV, before being filtered and finally de-gassed (i.e. de-bubbled), this may happen in any order. Furthermore, chemicals may be added to the liquid at any stage upstream of the liquid confinement system LCS and re-circulated liquid may also be added at any stage upstream of the liquid confinement system LCS. Where the re-circulated liquid is added will be dependent upon its purity. In the example illustrated in FIG. 5, solid lines indicate the re-circulated liquid is added downstream of the adding device 147, the distillation unit 120, the de-mineralizing unit 130, the de-hydrocarbonating unit 140, the UV source 145, the filter 150 and the gas content reduction device 160. The dashed lines show alternative positions at which recycled liquid may be added. In an implementation, the recycled liquid is added upstream of, at least, the filter 150.

In an embodiment of the invention, the liquid purifier purifies an immersion liquid which is water or an aqueous solution so that the immersion liquid has one or more of the properties (a) to (f) set out below. In an embodiment of the invention, the immersion liquid has one or more of the following properties (a) to (f):

(a) an electrical conductivity of from 0.055 microSiemens/cm to 0.5 microSiemens/cm;
(b) a pH of from 6 to 8;
(c) a content of organic compounds of 1 ppb or less;
(d) a particle content of no more than 0.5 particles having a dimension of 50 nm or greater per ml of immersion liquid;
(e) a dissolved oxygen concentration of 5 ppb or less; and
(f) a silica content of 100 ppt or less.

The electrical conductivity of the immersion liquid is typically controlled using a demineralizer, for example an ion exchanger or an electrical deionization unit, such that it is from 0.055 microSiemens/cm to 0.5 microSiemens/cm. In an embodiment, the electrical conductivity is 0.3 microSiemens/cm or less, for example 0.1 microSiemens/cm or less. The demineralizer can also be used to control the content of silica in the immersion liquid. In an embodiment, the silica content is 500 ppt or less, for example 200 ppt or less, 100 ppt or less, 90 ppt or less, or even 80 ppt or less.

The pH of the immersion liquid may be controlled by any suitable means. Typically, if main supply water purified using a liquid purifier in accordance with the above described embodiments is used, the pH will be within the range of 5 to 8, or of 6 to 8. If additives are included in the immersion liquid, the amount of such additives should be controlled such that the pH of the immersion liquid remains between 5 and 8. The desired pH can, alternatively, be achieved by adding a suitable buffer using, for example, adding device 147. The pH should be controlled by limiting the presence of components which may alter the pH of the liquid (e.g., water or aqueous solution). This is often preferred to the addition of for example, buffers, since the presence of a buffer may affect the purity of the immersion liquid in other ways.

The concentration of organic compounds in the immersion liquid is typically controlled by a de-hydrocarbonating unit 140 configured to reduce the hydrocarbon content. Similarly, the number of particles present in the immersion liquid can be controlled using filters. The particle content of the immersion liquid is the content of particles having a size larger than the lowest feature size in the lithography process. Thus, the particle content is the content of particles having at least one dimension of 50 nm or greater.

The oxygen content of the immersion liquid is typically controlled using a gas content reduction device as described above. In an embodiment, the oxygen content is reduced to 15 ppb or less, to 10 ppb or less, to 7 ppb or less, to 5 ppb or less, to 4 ppb or less, or to 3 ppb or less.

The liquid supply system 100 may optionally comprise a measuring device (not depicted in FIG. 5 but may be placed anywhere in the liquid supply system 100, in an embodiment between the liquid containment system LCS and the gas content reduction device 160) which can be used to measure one or more of the properties (a) to (f) of the immersion liquid. Such a measuring device may, for example, be located downstream of at least one, and, in an embodiment, all, of the components 120, 130, 140, 145, 150 and 160 of the liquid supply system. An off-line measuring device may also be employed, in which a sample of liquid is extracted from a suitable sampling point in the liquid supply system and fed to the off-line measuring device. The measuring device will, in one embodiment, comprise one or more measuring devices selected from an electrical conductivity measuring device, a pH sensor, a TOC analyzer, a particle counter, an oxygen sensor and a total silica measuring device. A bubble measuring device may also be used. Suitable techniques for measuring each of the properties (a) to (f) will be familiar to the skilled person in the art.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprising a liquid purifier configured to purify the liquid.

In an embodiment, the liquid purifier comprises a distillation unit. In an embodiment, the liquid purifier comprises a de-hydrocarbonating unit configured to reduce the hydrocarbon content of the liquid. In an embodiment, the liquid purifier comprises a demineralizer. In an embodiment, the demineralizer comprises a reverse osmosis unit, an ion exchanger or a de-ionization unit. In an embodiment, the liquid purifier comprises a filter. In an embodiment, the filter is dynamically isolated from one or more other components in the liquid supply system. In an embodiment, the liquid supply system includes a re-circulation mechanism configured to re-use liquid in the space without purifying the liquid for a re-use. In an embodiment, the liquid supply system includes a re-circulation mechanism configured to re-use liquid in the space and the liquid is partly or fully purified for a re-use. In an embodiment, the liquid supply system further comprises a circulation mechanism configured to provide liquid from the liquid purifier to the space. In an embodiment, the liquid is water or an aqueous solution and the liquid purifier is configured to purify the water or aqueous solution such that it has one or more of the following properties (a) to (f): (a) an electrical conductivity of from 0.055 microSiemens/cm to 0.5 microSiemens/cm; (b) a pH of from 5 to 8; (c) a content of organic compounds of 5 ppb or less; (d) a particle content of no more than 2 particles having a dimension of 50 nm or greater per ml of liquid; (e) a dissolved oxygen concentration of 15 ppb or less; and (f) a silica content of 500 ppt or less. In an embodiment, the pH of the liquid is from 6 to 8, the content of organic compounds of the liquid is 1 ppb or less, the particle content of the liquid is no more than 0.5 particles having a dimension of 50 nm or greater per ml of liquid, the dissolved oxygen concentration of the liquid is 5 ppb or less, the silica content of the liquid is 100 ppt or less, or any combination of the foregoing. In an embodiment, the liquid supply system comprises an ultraviolet source configured to irradiate the liquid prior to entry into the space. In an embodiment, the liquid supply system comprises a container or enclosure non-transparent to visible light surrounding the liquid supply system. In an embodiment, the liquid supply system comprises conduits which are non-transparent to visible light configured to supply the liquid from a liquid source to the space. In an embodiment, the liquid supply system comprises a device configured to add a lifeform-growth inhibiting chemical to the liquid.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprising an ultra-violet radiation source configured to irradiate the liquid prior to entry into the space.

In an embodiment, the ultra-violet radiation is selected to kill lifeforms in the liquid. In an embodiment, the liquid supply system comprises a particle filter configured to remove lifeforms killed by the ultra-violet radiation.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprises a component configured to prevent the liquid from being irradiated by visible light.

In an embodiment, the component comprises a container or enclosure non-transparent to visible light surrounding the liquid supply system. In an embodiment, the component comprises conduits which are non-transparent to visible light configured to supply the liquid from a liquid source to the space.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprising a device configured to add a lifeform-growth inhibiting chemical to the liquid.

In an embodiment, the chemical is selected from the group consisting of halogen containing compounds, alcohols, aldehydes, ozone and heavy metals. In an embodiment, the device is further configured to add a surfactant, a wetting agent, or both, to the liquid.

In an embodiment, there is provided a liquid for use in a space between a projection system of an immersion lithographic projection apparatus and a substrate to be imaged, the liquid comprising a lifeform-growth inhibiting chemical.

In an embodiment, the chemical is selected from the group consisting of halogen containing compounds, alcohols, aldehydes, ozone and heavy metals. In an embodiment, the liquid further comprises a surfactant, a wetting agent, or both.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid comprising a lifeform-growth inhibiting chemical.

In an embodiment, the chemical is selected from the group consisting of halogen containing compounds, alcohols, aldehydes, ozone and heavy metals. In an embodiment, the liquid further comprises a surfactant, a wetting agent, or both.

In an embodiment, there is provided a lithographic projection apparatus comprising: an illumination system configured to condition a radiation beam; a support constructed to hold a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid being water or an aqueous solution having one or more of the following properties (a) to (f): (a) an electrical conductivity of from 0.055 microSiemens/cm to 0.5 microSiemens/cm; (b) a pH of from 5 to 8 or from 6 to 8; (c) a content of organic compounds of 5 ppb or less or of 1 ppb or less; (d) a particle content of no more than 2 particles having a dimension of 50 nm or greater per ml of liquid, or of no more than 0.5 particles having a dimension of 50 nm or greater per ml of liquid; (e) a dissolved oxygen concentration of 15 ppb or less or of 5 ppb or less; and (f) a silica content of 500 ppt or less or of 100 ppt or less.

In an embodiment, the pH of the liquid is from 6 to 8, the content of organic compounds of the liquid is 1 ppb or less, the particle content of the liquid is no more than 0.5 particles having a dimension of 50 nm or greater per ml of liquid, the dissolved oxygen concentration of the liquid is 5 ppb or less, the silica content of the liquid is 100 ppt or less, or any combination of the foregoing. In an embodiment, the liquid supply system comprises a liquid containment system containing the liquid.

In an embodiment, there is provided a liquid for use in a space between a projection system of an immersion lithographic projection apparatus and a substrate to be imaged, wherein the liquid has one or more of the following properties (a) to (f): (a) an electrical conductivity of from 0.055 microSiemens/cm to 0.5 microSiemens/cm; (b) a pH of from 5 to 8 or from 6 to 8; (c) a content of organic compounds of 5 ppb or less or of 1 ppb or less; (d) a particle content of no more than 2 particles having a dimension of 50 nm or greater per ml of liquid, or of no more than 0.5 particles having a dimension of 50 nm or greater per ml of liquid; (e) a dissolved oxygen concentration of 15 ppb or less or of 5 ppb or less; and (f) a silica content of 500 ppt or less or of 100 ppt or less.

In an embodiment, the pH of the liquid is from 6 to 8, the content of organic compounds of the liquid is 1 ppb or less, the particle content of the liquid is no more than 0.5 particles having a dimension of 50 nm or greater per ml of liquid, the dissolved oxygen concentration of the liquid is 5 ppb or less, the silica content of the liquid is 100 ppt or less, or any combination of the foregoing.

While specific embodiments of the invention have been described above, it will be appreciated that the invention may be practiced otherwise than as described. The description is not intended to limit the invention.

The invention claimed is:

1. A lithographic projection apparatus comprising:
   a substrate table constructed to hold a substrate;
   a projection system configured to project a patterned radiation beam onto a target portion of the substrate;
   a liquid supply system configured to at least partly fill a space between the projection system and the substrate with a liquid, the liquid supply system comprising a liquid purifier configured to purify the liquid, the liquid purifier being upstream of an inlet of the liquid supply system to the space and/or downstream of an outlet of the liquid supply system from the space and the liquid purifier comprising a filter and a degasser configured to separate gas and liquid; and
   a dispenser configured to add a chemical to the liquid in the liquid supply system.

2. The apparatus according to claim 1, wherein the filter is dynamically isolated from one or more other components in the liquid supply system.

3. The apparatus according to claim 1, wherein the liquid supply system includes a re-circulation mechanism configured to re-use liquid in the space without purifying the liquid for a re-use.

4. The apparatus according to claim 1, wherein the liquid supply system comprises an ultra-violet radiation source configured to irradiate the liquid prior to entry into the space.

5. The apparatus according to claim 1, wherein the liquid supply system comprises a container or enclosure non-transparent to visible light surrounding the liquid supply system.

6. The apparatus according to claim 1, wherein the dispenser is configured to add a surfactant, a wetting agent, or both, to the liquid supply system.

7. The apparatus according to claim 1, wherein the degasser comprises a membrane configured to contact the liquid to separate gas and liquid.

8. The apparatus according to claim 1, further comprising a measurement device configured to measure a property of the liquid indicative of contamination.

9. The apparatus according to claim 8, wherein the measurement device is configured to measure the presence of particles in the liquid.

10. The apparatus according to claim 8, wherein the measurement device is located downstream in a flow path of the liquid from the degasser.

11. The apparatus according to claim 8, wherein the liquid supply system comprises a liquid confinement structure configured to at least partly confine the liquid within the space and the measurement device is configured to measure the property of the liquid in a flow path between the liquid confinement structure and the degasser.

12. The apparatus according to claim 8, wherein the property is an electrical property of the liquid.

13. The apparatus according to claim 1, wherein the liquid purifier comprises a distillation unit, or a de-hydrocarbonating unit configured to reduce the hydrocarbon content of the liquid, or a demineralizer, or any combination selected from the foregoing.

14. A lithographic projection apparatus comprising:
   a movable table;
   a projection system configured to project a patterned radiation beam onto a target portion of a substrate;
   a liquid supply system configured to at least partly fill a space between the projection system and the table with an immersion liquid;
   a member having:
      an opening, in a bottom surface of the member, configured to remove at least part of the immersion liquid from the space, and
      an open aperture located underneath a lower surface of the projection system and above the table, a cross-sectional dimension of the aperture being smaller than a cross-sectional dimensional of the lower surface of the projection system, the open aperture configured to allow the liquid to flow therethrough between above the open aperture and below the open aperture, and the open aperture configured to allow the radiation beam to pass therethrough;
   an inlet configured to supply the immersion liquid to the space at a position located above the aperture; and
   a liquid purifier comprising:
      a filter to separate particles from the immersion liquid, and
      a degasser configured to separate gas and liquid, the degasser being upstream from the inlet of the liquid supply system to the space and in a flow path of the immersion liquid to degas the immersion liquid before introduction into the space, the degasser comprising a membrane configured to contact the immersion liquid to separate gas and liquid of the immersion liquid.

15. The apparatus according to claim 14, further comprising a measurement device configured to measure an electrical popery of the immersion liquid.

16. The apparatus according to claim 15, wherein the liquid purifier further comprises a radiation source configured to irradiate the immersion liquid prior to entry into the space.

17. The apparatus according to claim 15, wherein the measurement device is located downstream in a flow path of the liquid from the degasser.

18. A device manufacturing method comprising:
   at least partly filling a space between a projection system of an exposure apparatus and a substrate with a liquid;
   purifying the liquid upstream of an inlet to the space and/or downstream of an outlet from the space, the purifying comprising filtering the liquid using a filter and separating gas and liquid using a degasser;
   adding a chemical to the liquid; and
   projecting a radiation beam through the liquid in the space onto a target portion of the substrate.

19. The method of claim 18, further comprising irradiating the liquid prior to entry into the space with ultra-violet radiation.

20. The method of claim 19, further comprising measuring an electrical property of the liquid.

21. The method of claim 20, further comprising degassing the liquid downstream from the outlet.

22. A lithographic projection apparatus comprising:
   a substrate table constructed to hold a substrate;
   a projection system configured to project a patterned radiation beam onto a target portion of the substrate;
   a liquid supply system configured to at least partly fill a space between the projection system and the substrate with a liquid, the liquid supply system comprising:
      a liquid purifier configured to purify the liquid, the liquid purifier being upstream of an inlet of the liquid supply system to the space and/or downstream of an outlet of the liquid supply system from the space and the liquid purifier comprising a filter and a degasser configured to separate gas and liquid, a conduit to route the liquid to the inlet, and a further conduit that branches off the conduit before the inlet and branches into the conduit upstream of where the further conduit branches off the conduit, the further conduit configured to route at least part of the liquid back upstream to a portion of the liquid supply system through which the at least part of the liquid has passed.

* * * * *

UNITED STATES PATENT AND TRADEMARK OFFICE
CERTIFICATE OF CORRECTION

Page 1 of 1

PATENT NO. : 8,953,144 B2
APPLICATION NO. : 13/240867
DATED : February 10, 2015
INVENTOR(S) : Marcel Mathijs Theodore Marie Dierichs et al.

It is certified that error appears in the above-identified patent and that said Letters Patent is hereby corrected as shown below:

On Title Page, Related U.S. Application Data, Item (63), Line 4
  replace "7,773,459"
  with --7,733,459--.

On Title Page 2, Column 2, Foreign Patent Documents, Line 12
  after "EP    1 653 501    5/2006"
  insert --EP    1 777 589 A2    4/2007--.

On Title Page 3, Item (56), References Cited, Foreign Patent Documents, Line 61
  delete "JP    1 777 589 A2    4/2007".

Signed and Sealed this
Nineteenth Day of May, 2015

Michelle K. Lee
*Director of the United States Patent and Trademark Office*